US007911818B2

(12) United States Patent
Chu

(10) Patent No.: US 7,911,818 B2
(45) Date of Patent: Mar. 22, 2011

(54) CONTENT ADDRESSABLE MEMORY HAVING BIDIRECTIONAL LINES THAT SUPPORT PASSING READ/WRITE DATA AND SEARCH DATA

(75) Inventor: Scott Chu, San Jose, CA (US)

(73) Assignee: NetLogic Microsystems, Inc., Santa Clara, CA (US)

( * ) Notice: Subject to any disclaimer, the term of this patent is extended or adjusted under 35 U.S.C. 154(b) by 136 days.

(21) Appl. No.: 12/405,000

(22) Filed: Mar. 16, 2009

(65) Prior Publication Data

US 2010/0232194 A1    Sep. 16, 2010

(51) Int. Cl.
*G11C 15/00* (2006.01)
(52) U.S. Cl. ............ 365/49.1; 365/49.11; 365/49.15; 365/49.16; 365/49.17; 365/49.18; 365/49.12; 365/49.13; 711/108
(58) Field of Classification Search .......... 365/49.1, 365/49.11, 49.12, 49.13, 50, 49.15, 49.16, 365/49.17, 49.18; 711/108
See application file for complete search history.

(56) References Cited

U.S. PATENT DOCUMENTS

| | | | |
|---|---|---|---|
| 4,646,271 A | 2/1987 | Uchiyama et al. | |
| 5,841,874 A | 11/1998 | Kempke et al. | |
| 6,137,707 A | 10/2000 | Srinivasan et al. | |
| 6,199,140 B1 | 3/2001 | Srinivasan et al. | |
| 6,396,749 B2 | 5/2002 | Al-Shamma et al. | |
| 6,487,101 B1 * | 11/2002 | Ashbrook et al. | 365/49.17 |
| 6,560,133 B2 * | 5/2003 | Yanagawa | 365/49.12 |
| 6,678,786 B2 | 1/2004 | Srinivasan et al. | |
| 6,697,911 B2 | 2/2004 | Srinivasan et al. | |
| 6,707,693 B1 | 3/2004 | Ichiriu | |
| 6,744,688 B2 * | 6/2004 | Gillingham et al. | 365/227 |
| 6,747,886 B1 * | 6/2004 | Morikawa | 365/49.1 |
| 6,922,751 B2 | 7/2005 | Regev et al. | |
| 6,961,810 B2 | 11/2005 | Srinivasan et al. | |
| 7,002,823 B1 | 2/2006 | Ichiriu | |
| 7,542,332 B1 * | 6/2009 | Kim | 365/154 |

* cited by examiner

*Primary Examiner* — Huan Hoang
*Assistant Examiner* — Kretelia Graham
(74) *Attorney, Agent, or Firm* — Mahamedi Paradice Kreisman LLP; William L. Paradice, III

(57) ABSTRACT

A CAM column structure includes an interface that drives search data to a plurality of CAM cells via a search line pair. The CAM cells are divided into sections, each section including: a set of CAM cells, a bit line pair coupled to the set of CAM cells, a sense amplifier coupled to the bit line pair, a tri-state read buffer configured to drive read data from the sense amplifier to the search line pair, and a pair of tri-state write buffers configured to drive write data from the search line pair to the bit line pair. In one embodiment, the pair of tri-state write buffers is replaced by a pair of switches that couple the search line pair to the sense amplifier. The search line pair may be segmented by tri-state buffers, which are controlled to drive the search, read and write data along the search line pair.

21 Claims, 7 Drawing Sheets

CONTENT ADDRESSABLE MEMORY HAVING BIDIRECTIONAL LINES THAT SUPPORT PASSING READ/WRITE DATA AND SEARCH DATA

FIELD OF THE INVENTION

The present invention relates to a content addressable memory (CAM) array. More specifically, the present invention relates to the accessing of CAM cells in a CAM array.

RELATED ART

FIG. 1 is a circuit diagram of a conventional content addressable memory (CAM) cell 100 that includes inverters 101-102 and transistors 103-108, which are connected as illustrated. CAM cell 100 is operates in response to signals provided/developed on word line WL, complementary bit line pair BL/BL#, complementary search line pair SL/SL# and match line MATCH.

In general, data is written to CAM cell 100 by applying a data value to complementary bit line pair BL/BL# and activating the word line WL. The write data value is stored on nodes N/N# by inverters 101-102.

Data is read from CAM cell 100 by pre-charging the complementary bit line pair BL/BL#, and then activating the word line WL. Under these conditions, the data value stored in CAM cell 100 causes a differential voltage to be developed across the bit line pair BL/BL#. A sense amplifier 110 coupled to bit line pair BL/BL# is also activated, thereby amplifying the differential voltage on the bit line pair BL/BL#, such that this differential voltage has a full voltage swing between a pair of supply voltages (e.g., $V_{DD}$ and 0 Volts).

A search operation to CAM cell 100 is performed by pre-charging the match line MATCH, and then applying a search value to complementary search line pair SL/SL#. If the search value matches the data stored by inverters 101-102, the match line MATCH will remain in the pre-charged state. However, if the search value does not match the data stored by inverters 101-102, a conductive path will be created between the match line MATCH and ground, thereby discharging the match line.

A plurality of CAM cells, identical to CAM cell 100, can be connected in a plurality of rows and columns to form a CAM array. Within each column of the CAM array, the bit lines BL/BL# are active only during read and write cycles of the CAM array. That is, data is transmitted on the bit lines BL/BL# only while data is being written to or read from CAM cells of the CAM array. The search lines SL/SL# are active only during search cycles of the CAM array. That is, search data is only transmitted on the search lines SL/SL# when search data is being compared with the contents of the CAM array.

The specified read and write speed of the CAM array limits the number of cells that can be connected to the same set of complementary bit lines BL/BL#. That is, the specified read and write speed of the CAM array limits the continuous column height allowed in the CAM array. While a column may be divided into smaller column sections, problems exist in the ability to access those sections. The smaller column sections can be accessed in parallel, resulting in an undesirable increase in layout area. Alternately, the smaller column sections can be accessed serially, thereby resulting in an undesirable reduction in speed performance.

FIG. 2 is a block diagram of a conventional CAM array column 200, which includes four column sections 201-204, tri-state read buffers R1-R6, tri-state write buffers W1-W6, search buffers S1-S2, column interface 210 and row interface 220. Column sections 201, 202, 203 and 204 include CAM cell sets MC1-MC2, MC3-MC4, MC5-MC6 and MC7-MC8, respectively. Each of the CAM cell sets MC1-MC8 includes, for example, 512 individual CAM cells, each identical to CAM cell 100 (FIG. 1). Column sections 201, 202, 203 and 204 also include local sense amplifiers SA12, SA34, SA56 and SA78, respectively, which are coupled to the associated CAM cell sets by local bit line pairs $BL_1/BL_1\#$, $BL_2/BL_2\#$, $BL_3/BL_3\#$ and $BL_4/BL_4\#$, respectively. Adjacent sets of local bit line pairs are coupled by tri-state read buffers R1-R6 and tri-state write buffers W1-W6 as illustrated. CAM cell sets MC1-MC4 are coupled to local search line pairs $SL_1/SL_1\#$, and CAM cell sets MC5-MC8 are coupled to local search line pairs $SL_2/SL_2\#$. Local search line pairs $SL_1/SL_1\#$ and $SL_2/SL_2\#$ are coupled by search buffers S1-S2 as illustrated.

A read operation to a CAM cell in CAM cell set MC1 is performed as follows. The local bit line pairs are initially pre-charged by local pre-charge circuitry (not shown). The tri-state read buffers R1-R6 and the tri-state write buffers W1-W6 are initially maintained in a high-impedance state, such that the local bit line pairs are isolated from one another. The read address is decoded by row interface 220, and the word line (not shown) associated with this decoded read address is activated within CAM cell set MC1, such that a differential voltage representative of the read data value is developed across the local bit line pair $BL_1/BL_1\#$. The row interface 220 then activates the local sense amplifier SA12 associated with the decoded read address, thereby amplifying the differential voltage on the bit line pair $BL_1/BL_1\#$. Row interface 220 then activates the tri-state read buffers R1-R6, such that the read data value is routed from the local sense amplifier SA12 to column interface 210 through local bit line pairs $BL_1/BL_1\#$, $BL_2/BL_2\#$, $BL_3/BL_3\#$ and $BL_4/BL_4\#$. After the column interface 210 receives the read data value, row interface 220 de-activates the word line, the local sense amplifier SA12 and the tri-state read buffers R1-R6. The local pre-charge circuits are then activated to pre-charge the local bit line pairs for the next operation.

Note that read buffers R1-R6 are required to drive the read data value to column interface 210 because of the large number of CAM cells in the column. Without read buffers R1-R6, the time required to propagate the read data value to column interface 210 would be excessive. However, because the read data value must propagate through three series-connected sets of tri-state buffers R1-R6, the read cycle time is still relatively long (when compared with a CAM array column having less than about 1 k CAM cells). In addition, because the local bit line pairs are required to transmit the read data value to column interface 210, the column interface 210 must receive the read data value before the bit line pre-charge operation can begin.

A write operation to a CAM cell in CAM cell set MC1 is performed as follows. The write address is decoded by column interface 210 and row interface 220, and the write data value is driven from column interface 210 onto local bit line pair $BL_4/BL_4\#$. Row interface 220 activates the tri-state write buffers W1-W6, such that the write data value is driven to local bit line pair $BL_1/BL_1\#$ (through local bit line pairs $BL_4/BL_4\#$, $BL_3/BL_3\#$, and $BL_2/BL_2\#$). Row interface 220 then activates the word line associated with the decoded write address within CAM cell set MC1, thereby causing the write data value to be written to the addressed CAM cell. After the write data value has been written, row interface 220 de-activates the word line and the tri-state write buffers W1-W6. The local pre-charge circuits are then activated to pre-charge the local bit line pairs for the next operation. Note that it undesirably requires a long time for write data value to propagate through the tri-state write buffers W1-W6 during a write operation.

To implement a search operation, column interface 210 drives a search value onto the complementary search line pair $SL_2/SL_2\#$. Search buffers S1-S2 drive the search value onto the complementary search line pair $SL_1/SL_1\#$. As a result, all of the CAM cell sets MC1-MC8 receive the search value during the search operation.

It would be desirable to increase the read and write speeds of a CAM array, without significantly increasing the required layout area of the CAM array.

SUMMARY

Accordingly, the present invention includes a CAM array column structure that includes a first search line pair and a plurality of column sections. Each column section includes a plurality of CAM cells, a local sense amplifier, and a local bit line pair that couples the CAM cells to the local sense amplifier. Each column section further includes at least one tri-state read buffer configured to drive read data from the local sense amplifier to the first search line pair, and a pair of tri-state write buffers configured to drive write data from the first search line pair to the local bit line pair. In an alternate embodiment, the pair of tri-state write buffers are replaced by a pair of switches that are configured to selectively couple/de-couple the first search line pair to the local sense amplifier.

During a read operation, read data is transferred from a CAM cell to the corresponding local sense amplifier over the corresponding local bit line pair. The tri-state read buffer coupled to the local sense amplifier is then controlled to drive the read data to the first search line pair. The local bit lines can be pre-charged while the read data is being transmitted on the first search line pair, thereby reducing the read cycle time.

During a write operation, write data is provided on the first search line pair. If a column section includes a CAM cell that should receive the write data, the tri-state write buffers within this column section are activated, thereby driving the write data onto the corresponding local bit line pair(s). If the CAM array column structure includes switches instead of tri-state write buffers, then the switches within the selected column sections are turned on, thereby routing the write data to the corresponding local sense amplifier(s). The local sense amplifier(s) are then activated, thereby developing write data having a full voltage supply swing on the local bit line pair(s). In this manner, the write data may be transmitted to a plurality of local bit line pairs in parallel, without speed or area penalty.

During a search operation, a search value is provided on the first search line pair, such that the search value is provided to the CAM cells in each of the column sections.

Allowing read and write data to be transmitted in a bi-directional manner on the first search line pair advantageously increase the read and write speed of the CAM array column structure.

In accordance with one embodiment of the present invention, the CAM array column structure can be expanded to include a second search line pair and a second plurality of column sections, wherein the first and second search line pairs are joined by a plurality of tri-state buffers.

The present invention will be more fully understood in view of the following description and drawings.

DETAILED DESCRIPTION

Figure 3:
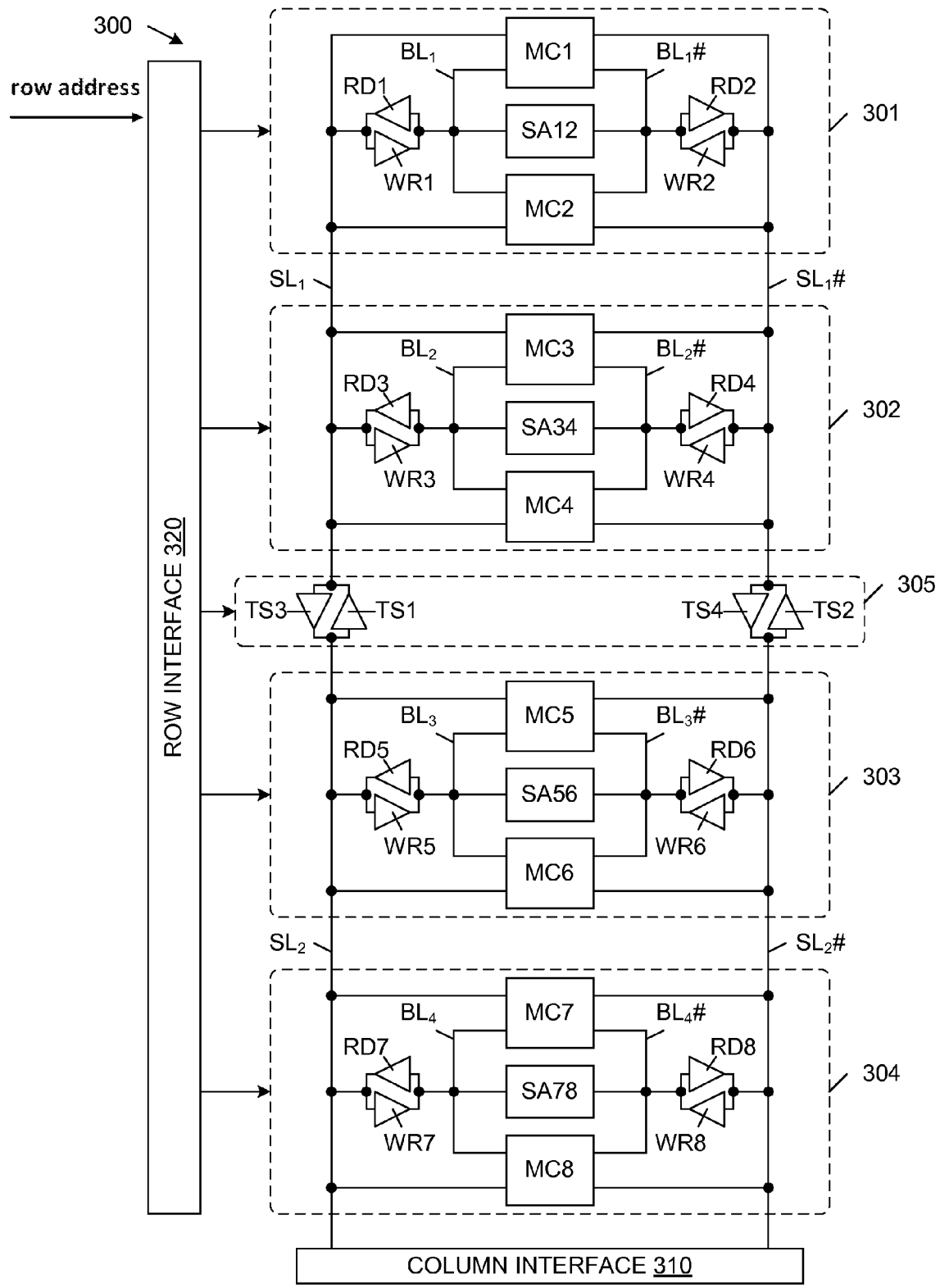
FIG. 3 is a block diagram of a CAM array column in accordance with one embodiment of the present invention.

FIG. 3 is a block diagram of a CAM array column 300 in accordance with one embodiment of the present invention. CAM array column 300 includes four column sections 301-304, repeater 305, column interface 310 and row interface 320. Although the present invention is described in connection with four column sections 301-304, it is understood that CAM array column 300 can be modified to include other numbers of column sections in other embodiments. Column sections 301, 302, 303 and 304 include CAM cell sets MC1-MC2, MC3-MC4, MC5-MC6 and MC7-MC8, respectively, tri-state read buffers RD1-RD2, RD3-RD4, RD5-RD6 and RD7-RD8, respectively, and tri-state write buffers WR1-WR2, WR3-WR4, WR5-WR6 and WR7-WR8, respectively.

Figure 1:
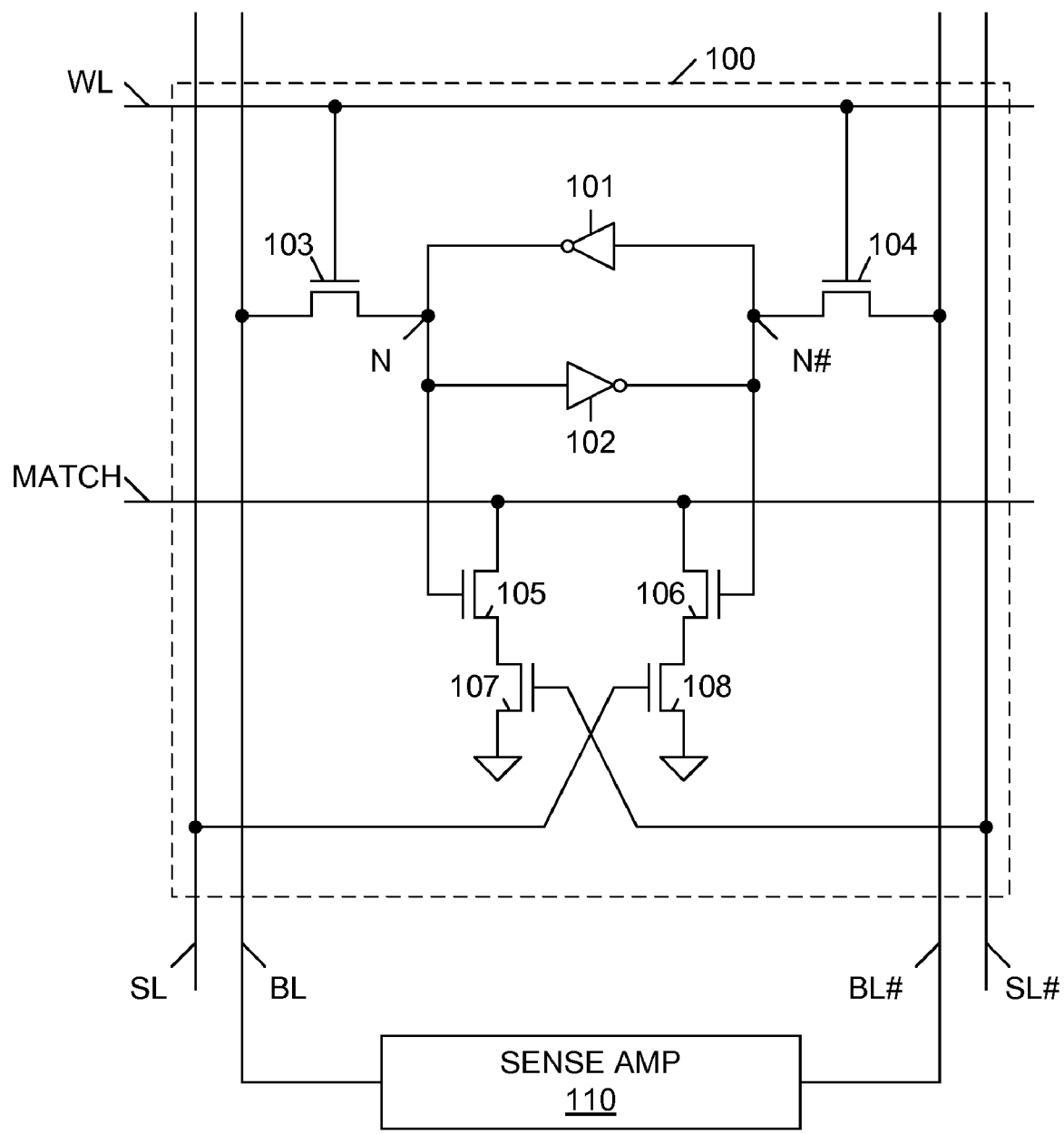
FIG. 1 is a circuit diagram of a conventional content addressable memory (CAM) cell.
Figure 2:
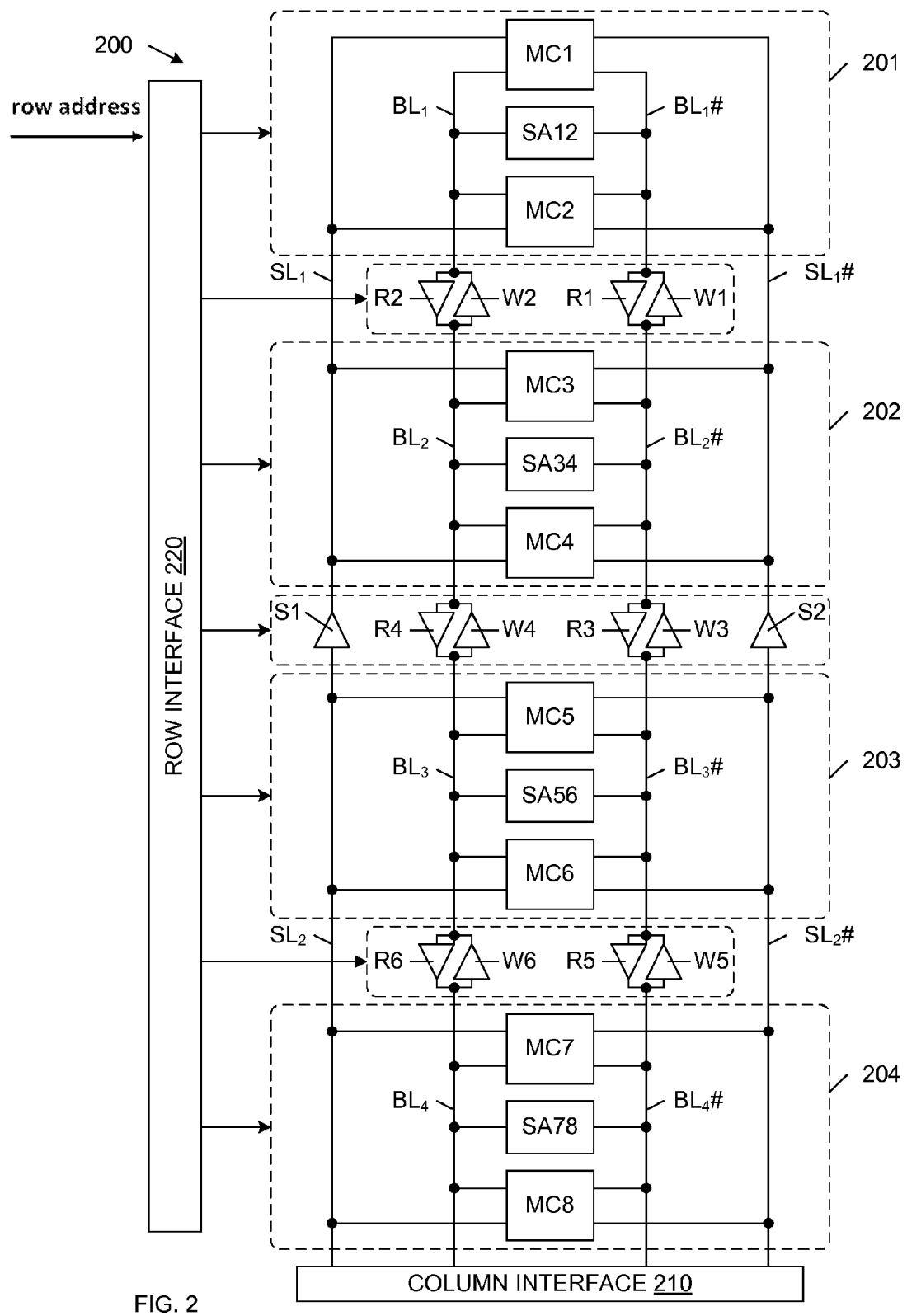
FIG. 2 is a block diagram of a conventional CAM array column.

Each of the CAM cell sets MC1-MC8 includes a plurality of individual CAM cells. In one embodiment, for example, each of the CAM cell sets MC1-MC8 includes 512 individual CAM cells, wherein each of the individual CAM cells is identical to CAM cell 100 (FIG. 1). Column sections 301, 302, 303 and 304 also include local sense amplifiers SA12, SA34, SA56 and SA78, respectively, which are coupled to the associated CAM cell sets by local bit line pairs $BL_1/BL_1\#$, $BL_2/BL_2\#$, $BL_3/BL_3\#$ and $BL_4/BL_4\#$, respectively.

CAM cell sets MC1-MC4 are commonly connected to local search line pair $SL_1/SL_1\#$, and CAM cell sets MC5-MC8 are commonly connected to local search line pair $SL_2/SL_2\#$. Repeater circuit 305 is located between local search line pairs $SL_1/SL_1\#$ and $SL_2/SL_2\#$, thereby coupling these local search line pairs. Repeater circuit 305 includes tri-state buffers TS1-TS4. Tri-state buffers TS1 and TS2 have input terminals coupled to local search lines $SL_2$ and $SL_2\#$, respectively, and output terminals coupled to local search lines $SL_1$ and $SL_1\#$, respectively. Tri-state buffers TS3 and TS4 have input terminals coupled to local search lines $SL_1$ and $SL_1\#$, respectively, and output terminals coupled to local search lines $SL_2$ and $SL_2\#$, respectively. As described in more detail below, tri-state buffers TS1-TS4 are controlled by row interface 320.

Within each of the column sections 301-304 a pair of tri-state read buffers and a pair of tri-state write buffers couple the associated bit line pair/sense amplifier to the associated local search lines. For example, within column section 301, tri-state read buffers RD1 and RD2 have input terminals coupled to bit lines $BL_1$ and $BL_1\#$, respectively, and output terminals coupled to local search lines $SL_1$ and $SL_1\#$, respectively. Also within column section 301, tri-state write buffers WR1 and WR2 have input terminals coupled to local search lines $SL_1$ and $SL_1\#$, respectively, and output terminals coupled to local bit lines $BL_1$ and $BL_1\#$, respectively. Within column section 302, tri-state read buffers RD3-RD4 and tri-state write buffers WR3-WR4 are coupled to local bit lines $BL_2/BL_2\#$ and local search lines $SL_1/SL_1\#$ in a similar manner. Within column section 303, tri-state read buffers RD5-RD6 and tri-state write buffers WR5-WR6 are coupled to local bit lines $BL_3/BL_3\#$ and local search lines $SL_2/SL_2\#$ in a similar manner. Within column section 304, tri-state read buffers RD7-RD8 and tri-state write buffers WR7-WR8 are coupled to local bit lines $BL_4/BL_4\#$ and local search lines $SL_2/SL_2\#$ in a similar manner.

A read operation to a CAM cell in CAM cell column 300 is performed as follows. Prior to the start of the read operation, the local bit line pairs are pre-charged by local pre-charge circuitry (not shown). Each of the tri-state read and write buffers RD1-RD8 and WR1-WR8 are initially maintained in a high-impedance state, such that the local bit line pairs $BL_1/BL_1\#$, $BL_2/BL_2\#$, $BL_3/BL_3\#$ and $BL_4/BL_4\#$ are isolated from the local search line pairs $SL_1/SL_1\#$ and $SL_2/SL_2\#$. Tri-state buffers TS1 and TS2 are initially maintained in an activated state, and tri-state buffers TS3 and TS4 are initially maintained in a high-impedance state. The row address of the read operation is decoded by row interface 320. In response, row interface 320 activates the word line (not shown) associated with the addressed row. In the described example, it is assumed that the CAM cell being read is located within column section 301. Thus, when the word line associated with this CAM cell is activated, a differential voltage representative of the read data value is developed across the local bit line pair $BL_1/BL_1\#$.

The row interface 320 then activates the local sense amplifier SA12 associated with the decoded read address, thereby amplifying the differential voltage on the local bit line pair $BL_1/BL_1\#$ to a full supply voltage swing (e.g., $V_{DD}$ to 0 Volts). At this time, row interface 320 activates the tri-state read buffers RD1-RD2 within the accessed column section 301, de-activates the tri-state buffers TS1-TS2 within repeater 305, and activates the tri-state buffers TS3-TS4 within repeater 305. The activated tri-state read buffers RD1 and RD2 drive the read data value from the local sense amplifier SA12 to the local search lines $SL_1$ and $SL_1\#$, respectively. The activated tri-state buffers TS3 and TS4 drive the read data value from the local search lines $SL_1$ and $SL_1\#$, respectively, to the local search lines $SL_2$ and $SL_2\#$, respectively. Column interface 310 receives the read data value from the local search lines $SL_2$-$SL_2\#$. In accordance with one embodiment, row interface 320 will only activate the tri-state buffers TS3-TS4 (and de-activate the tri-state buffers TS1-TS2) if the read operation accesses a CAM cell in column section 301 or 302. In an alternate embodiment, row interface 320 may activate the tri-state buffers TS3-TS4 (and de-activate the tri-state buffers TS1-TS2) during any read operation to CAM array column 300.

In accordance with one embodiment of the present invention, when the tri-state read buffers RD1-RD2 are activated, these buffers 'hold' (or latch) the read data signals provided on their input terminals. For example, suppose that the local sense amplifier SA12 provides read data signals having values of $V_{DD}$ and 0 Volts to tri-state read buffers RD1 and RD2, respectively. Upon being activated, these tri-state buffers RD1 and RD2 provide output signals having values of $V_{DD}$ and 0 Volts respectively. Tri-state buffers RD1 and RD2 continue to provide these output signals until these buffers are de-activated, even if the signals provided by the local sense amplifier SA12 change. In accordance with one embodiment of the present invention, row interface 320 de-activates the word line and the local sense amplifier SA12 immediately after the tri-state read buffers RD1-RD2 have been activated.

Row interface 320 then activates the local pre-charge circuit to pre-charge the local bit line pair $BL_1$-$BL_1\#$ for the next operation. In the described embodiments, the local bit line pair $BL_1$-$BL_1\#$ is pre-charged in parallel with the transmission of the read data value to column interface 310. This advantageously allows the read cycle to be shortened with respect to the read cycle of the CAM array column 100 of FIG. 1. At the end of the read operation, row interface 320 de-activates the tri-state read buffers RD1-RD2 and the tri-state buffers TS3-TS4, such that these buffers return to high impedance states. At the end of the read operation, row interface 320 also activates the tri-state buffers TS1-TS2.

Note that the read data value only needs to propagate through two buffers (e.g., RD1 and TS3) to reach column interface 310. This is a significant improvement over the CAM array column 100 of FIG. 1, which requires the read data value to propagate through four buffers. This advantageously allows the read cycle of the CAM array column 300 to be shorter than the read cycle of the CAM array column 100 of FIG. 1.

A write operation to a CAM cell in CAM cell column 300 is performed as follows. Prior to the start of the write operation, the local bit line pairs are in pre-charged states, the tri-state buffers RD1-RD8, WR1-WR8 and TS3-TS4 are in high-impedance states, and the tri-state buffers TS1-TS2 are activated. The write address specified by the write operation is decoded by column interface 310 and row interface 320, and the associated write data value is driven from column interface 310 onto local search line pair $SL_2/SL_2\#$. The activated tri-state buffers TS1-TS2 drive the write data value from local search line pair $SL_2/SL_2\#$ to local search line pair $SL_1/SL_1\#$. In the described example, it is assumed that the CAM cell being written is located within CAM cell section 302. Upon detecting that the write address specifies a row within column section 302, row interface 320 activates the local tri-state write buffers WR3-WR4, such that the write data value is driven from local search line pair $SL_1/SL_1\#$ to local bit line pair $BL_2/BL_2\#$. Row interface 320 then activates the word line associated with the decoded write address within column section 302, thereby causing the write data value to be written to the addressed CAM cell. After the write data value has been written, row interface 320 de-activates the word line and the tri-state write buffers WR3-WR4. The local pre-charge circuit is then activated to pre-charge the local bit line pair $BL_2/BL_2\#$ for the next operation.

Note that the write data value only needs to propagate through two buffers (e.g., TS1 and WR3) to reach the local bit lines pair $BL_2/BL_2\#$. This is a significant improvement over the CAM array column 100 of FIG. 1, which requires the write data value to propagate through four buffers. This advantageously allows the write cycle of the CAM array column 300 to be shorter than the write cycle of the CAM array column 100 of FIG. 1.

Note that a write data value may be simultaneously written to multiple rows of CAM array column 300 by controlling row interface 320 in the appropriate manner. For example, row interface 320 may simultaneously activate tri-state write buffers WR1-WR8 to simultaneously write data to one or more rows within each of column sections 301-304. (Note that row interface 320 would also activate the appropriate word lines to write the data value to the desired rows.)

In an alternate embodiment, row interface 320 may initially deactivate the tri-state buffers TS1-TS2 to a high-impedance state, and only activate these tri-state buffers TS1-TS2 during a write operation if the write operation addresses a CAM cell in column section 301 or 302.

A search operation to CAM cell column 300 is performed as follows. Again, tri-state buffers RD1-RD8, WR1-WR8 and TS3-TS4 are initially maintained in a high-impedance state, and tri-state buffers TS1-TS2 are initially maintained in an activated state. Match lines (not shown) within CAM cell column 300 are initially pre-charged in the manner described above in connection with FIG. 1. Column interface 310 then drives a search value onto local search line pair $SL_2/SL_2\#$. The activated tri-state buffers TS1 and TS2 drive the search value from local search line pair $SL_2/SL_2\#$ to local search line pair $SL_1/SL_1\#$. As a result, all of the CAM cells in CAM cell sets MC1-MC8 receive the search value during the search operation.

Note that the search value only needs to propagate through one set of buffers (e.g., TS1-TS2) to reach the CAM cell sets MC1-MC4. This is equivalent to the search value path of the CAM array column 100 of FIG. 1.

Figure 4:
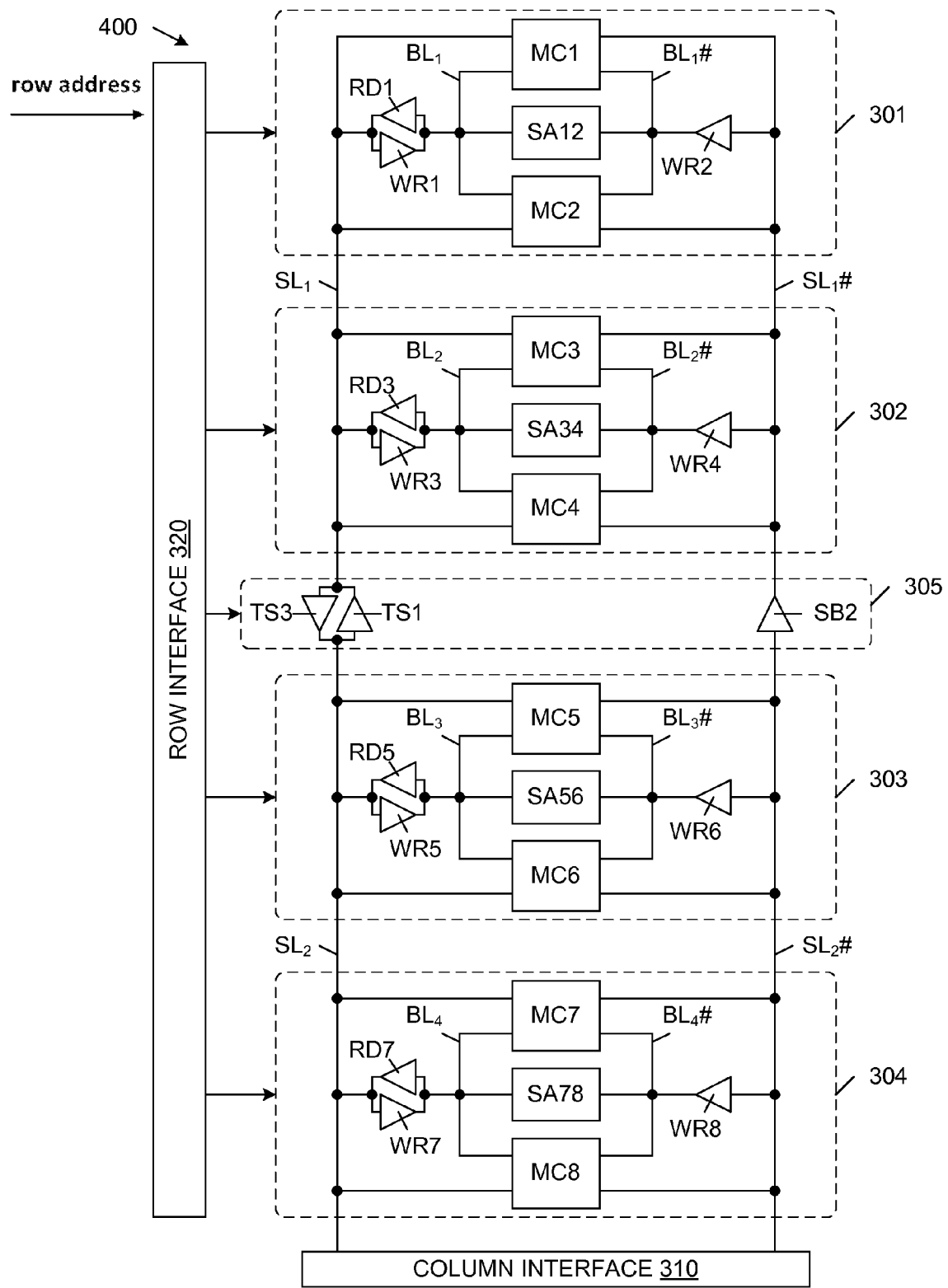
FIG. 4 is a block diagram of a CAM array column in accordance with a first alternate embodiment of the present invention.

FIG. 4 is a block diagram of a CAM array column 400 in accordance with an alternate embodiment of the present invention. Because CAM array column 400 is similar to CAM array column 300, similar elements in FIGS. 3 and 4 are labeled with similar reference numbers. Thus, CAM array column 400 includes all of the elements of CAM array column 300, except for tri-state read buffers RD2, RD4, RD6 and RD8, and tri-state buffers TS2 and TS4, which are not used in CAM array column 400. Note that tri-state buffer TS2 is replaced with a conventional (continuously activated) buffer SB2 within CAM array column 400. Write operations and search operations are performed in substantially the same manner in CAM array columns 300 and 400. Note however, that buffer SB2 is continuously activated, and is not under the control of row interface 320.

Read operations are performed slightly differently in CAM array columns 300 and 400. More specifically, read data values are read out of CAM array column 400 as a single data signal, instead of as a pair of complementary data signals. Thus, all read data values from CAM cell sets MC1-MC4 are routed to column interface 310 as a single data signal on local search lines $SL_1$ and $SL_2$. Similarly, read data values from CAM cell sets MC5-MC8 are routed to column interface 310 as a single data signal on local search line $SL_2$. CAM array column 400 advantageously requires six fewer tri-state buffers and one more conventional buffer than CAM array column 300, thereby reducing the required layout area of CAM array column 400 with respect to CAM array column 300. Note that CAM array column 400 requires two more tri-state buffers, and one fewer conventional buffer than conventional CAM array column 200.

Figure 5:
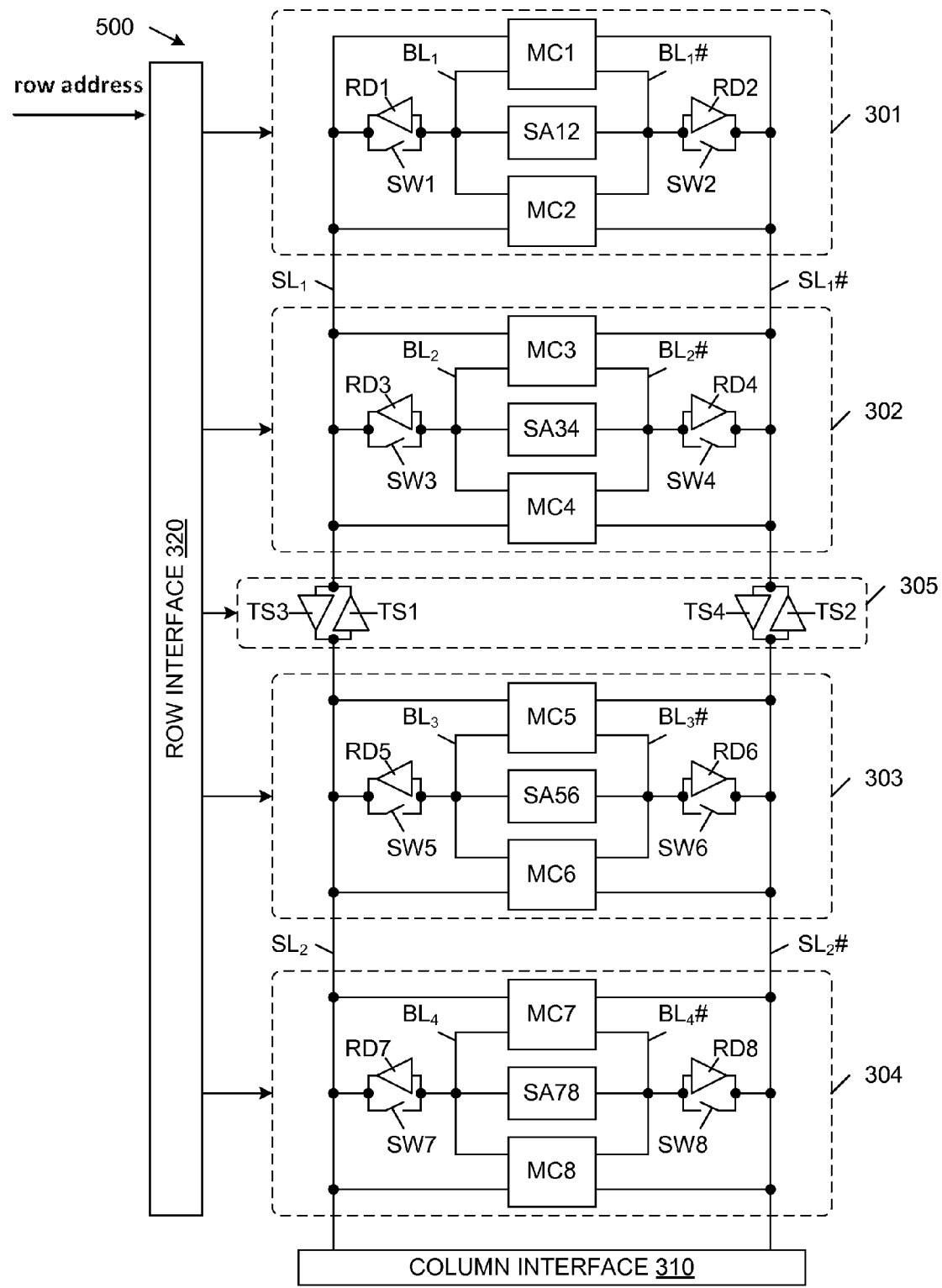
FIG. 5 is a block diagram of a CAM array column in accordance with a second alternate embodiment of the present invention.

FIG. 5 is a block diagram of a CAM array column 500 in accordance with an alternate embodiment of the present invention. Because CAM array column 500 is similar to CAM array column 300, similar elements in FIGS. 3 and 5 are labeled with similar reference numbers. Thus, CAM array column 500 includes all of the elements of CAM array column 300, except for tri-state write buffers WR1-WR8, which are replaced by switches SW1-SW8, respectively, in CAM array column 500. In accordance with one embodiment, switches SW1-SW8 are implemented with MOS transistors. However, switches SW1-SW8 can be implemented by different circuit elements in other embodiments.

Read operations and search operations are performed in substantially the same manner in CAM array columns 300 and 500. Note that switches SW1-SW8 are turned off (non-conductive) by row interface 320 during read operations and search operations within CAM array column 500.

Write operations are performed slightly differently in CAM array columns 300 and 500. A write operation to a CAM cell in column section 301 of CAM cell column 500 is performed as follows. Prior to the start of the write operation, the local bit line pairs are in pre-charged states, tri-state buffers RD1-RD8 and TS3-TS4 are in high-impedance states, tri-state buffers TS1-TS2 are activated, and switches SW1-SW8 are turned off. The write address specified by the write operation is decoded by column interface 310 and row interface 320, and the associated write data value is driven from column interface 310 onto local search line pair $SL_2/SL_2\#$. The activated tri-state buffers TS1-TS2 drive the write data value from local search line pair $SL_2/SL_2\#$ to local search line pair $SL_1/SL_1\#$. Upon determining that the write address specifies a row within column section 301, row interface 320 turns on the corresponding local switches SW1-SW2 (making these switches conductive), such that the write data value is driven from local search line pair $SL_1/SL_1\#$ to local bit line pair $BL_1/BL_1\#$. Row interface 320 also activates the local sense amplifier SA12 associated with the decoded write address, such that the write data value provided on the bit line pair $BL_1/BL_1\#$ is amplified (to a full supply voltage swing). Row interface 320 then activates the word line associated with the decoded write address within column section 301, thereby causing the write data value to be written to the addressed CAM cell. After the write data value has been written, row interface 320 de-activates the word line, de-activates the local sense amplifier SA12, and turns off local switches SW1-SW2. The local pre-charge circuit is then activated to pre-charge the local bit line pair $BL_1/BL_1\#$ for the next operation. By replacing tri-state write buffers WR1-WR8 with simple switches SW1-SW8 and using the local sense amplifiers to amplify the write data values, CAM array column 500 effectively eliminates eight tri-state buffers from the design of CAM array column 500, while adding only eight switches. Note that CAM array column 500 requires the same number of tri-state buffers, eight more switches and two fewer conventional buffers than conventional CAM array column 200.

Figure 6:
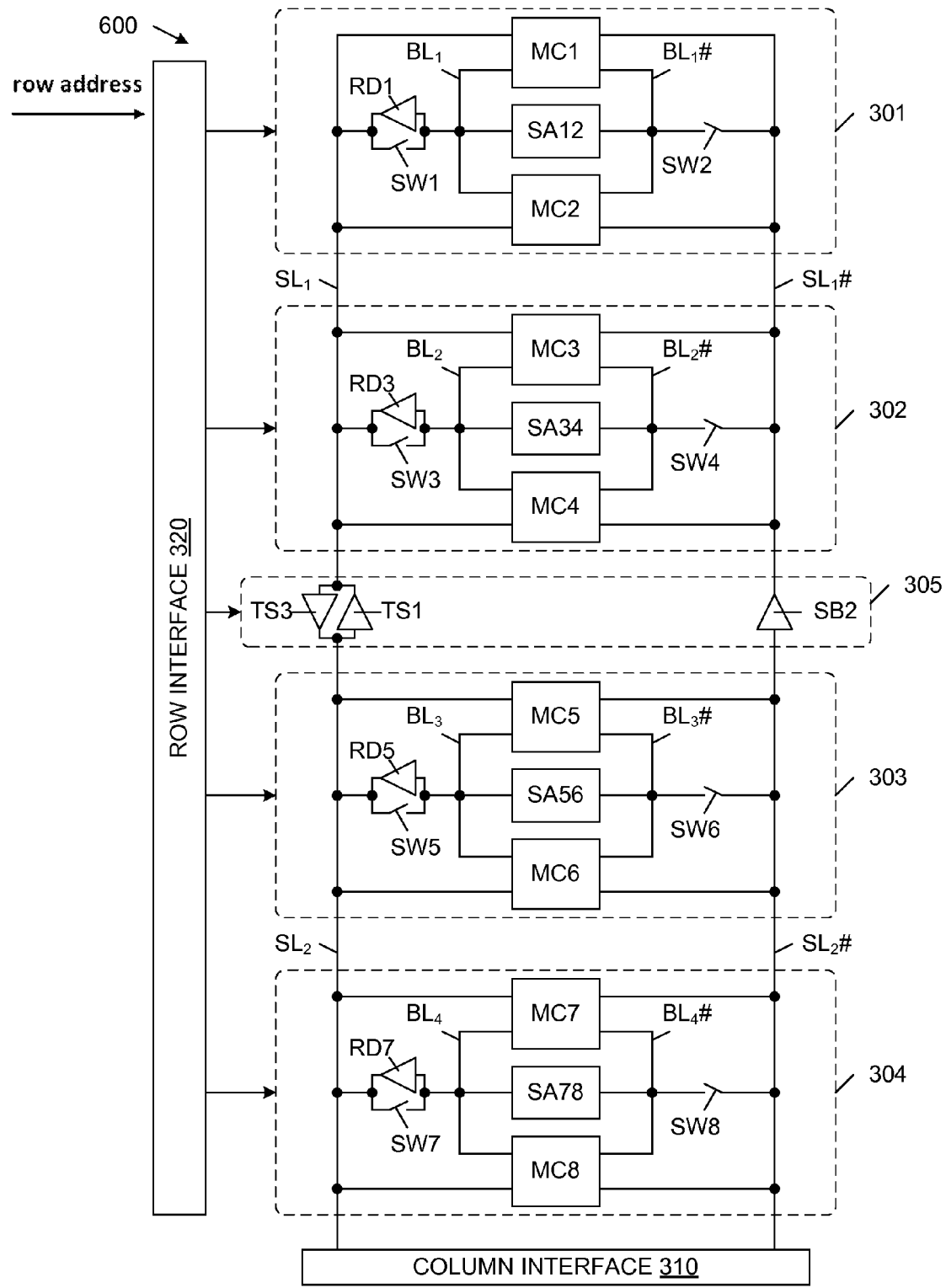
FIG. 6 is a block diagram of a CAM array column in accordance with a third alternate embodiment of the present invention.

FIG. 6 is a block diagram of a CAM array column 600 in accordance with an alternate embodiment of the present invention. Because CAM array column 600 is similar to CAM array column 400, similar elements in FIGS. 4 and 6 are labeled with similar reference numbers. Thus, CAM array column 600 includes all of the elements of CAM array column 400, except for tri-state write buffers WR1-WR8, which are replaced by switches SW1-SW8, respectively, in CAM array column 600.

Read operations and search operations are performed in substantially the same manner in CAM array columns 400 and 600. Note that switches SW1-SW8 are turned off by row interface 320 during read operations and search operations within CAM array column 600.

Write operations are performed in substantially the same manner in CAM array column 600 and CAM array column 500 (FIG. 5). Thus, prior to the write operation, the local bit line pairs are pre-charged, tri-state buffers RD1, RD3, RD5, RD7 and TS3 are in high-impedance states, tri-state buffer TS1 is activated, and switches SW1-SW8 are turned off. The write address is decoded, and the write data value is driven from column interface 310 onto local search line pairs $SL_2/SL_2\#$ and $SL_1/SL_1\#$. Row interface 320 turns on the local switches associated with the decoded write address, such that the write data value is driven from a local search line pair to a local bit line pair. Row interface 320 also activates the local sense amplifier associated with the decoded write address, such that the write data value provided on the local bit line pair is amplified to a full supply voltage swing. Row interface 320 then activates the word line associated with the decoded write address, thereby causing the write data value to be written to the addressed CAM cell. After the write data value has been written, row interface 320 de-activates the previously activated word line and local sense amplifier, and turns off the previously turned on local switches. The local pre-charge circuit is then activated to pre-charge the local bit line pair for the next operation.

By replacing tri-state write buffers WR1-WR8 with simple switches SW1-SW8 and using the local sense amplifiers to amplify the write data values, CAM array column 600 effectively eliminates eight tri-state buffers from the design of CAM array column 400, while adding only eight switches. Note that CAM array column 600 requires the six fewer tri-state buffers, eight more switches and one fewer conventional buffer than conventional CAM array column 200.

Figure 7:
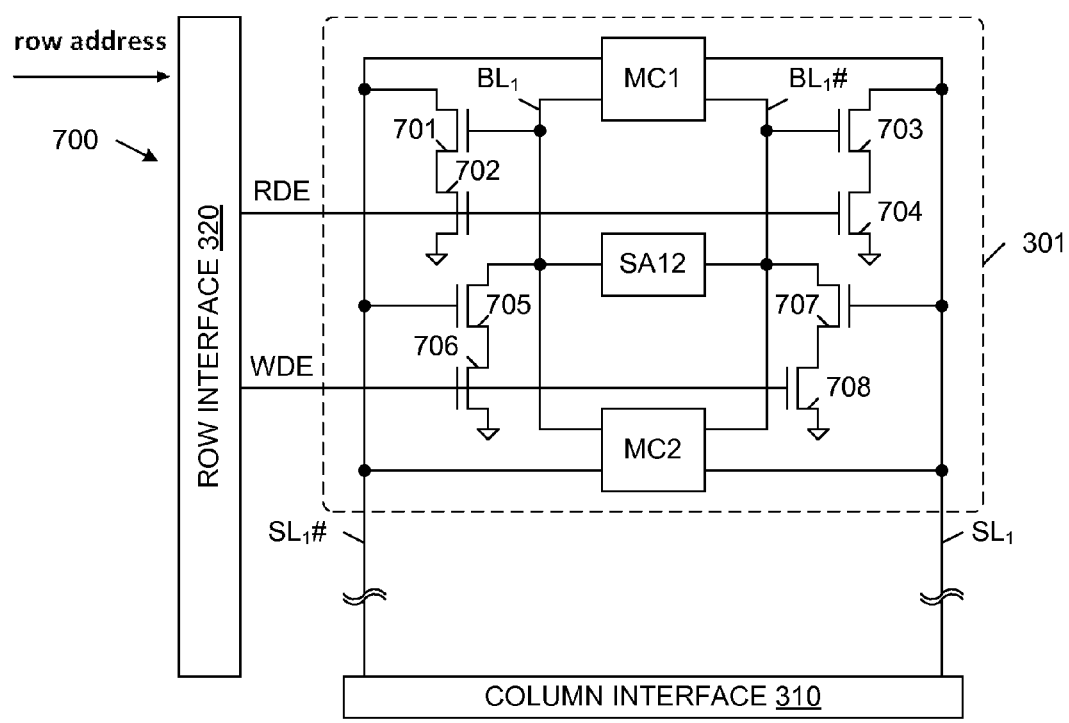
FIG. 7 is a block diagram of a CAM array column in accordance with a fourth alternate embodiment of the present invention.

FIG. 7 is a block diagram illustrating column section 301 of a CAM array column 700 in accordance with yet another embodiment of the present invention, wherein n-channel transistors 701-704 are used to implement a read driver, and n-channel transistors 705-708 are used to implement a write driver. Note that column sections 302-304 of CAM array column 700 (not shown in FIG. 7) will include similar n-channel transistors to implement similar read drivers and write drivers in this embodiment. Note that the polarities of the search lines $SL_1$ and $SL_1\#$ are reversed with respect to the embodiments of FIGS. 3-6.

Within the read driver, the drains of transistors 701 and 703 are coupled to search lines $SL_1\#$ and $SL_1$, respectively. The gates of transistors 701 and 703 are coupled to bit lines BL and $BL_1\#$, respectively. The sources of transistors 701 and 703 are coupled to the drains of transistors 702 and 704, respectively. The sources of transistors 702 and 704 are coupled to ground, and the gates of transistors 702 and 704 are coupled to receive a read driver enable signal RDE from row interface 320.

Within the write driver, the drains of transistors 705 and 707 are coupled to bit lines $BL_1$ and $BL_1\#$, respectively. The gates of transistors 705 and 707 are coupled to search lines $SL_1\#$ and $SL_1$, respectively. The sources of transistors 705 and 707 are coupled to the drains of transistors 706 and 708, respectively. The sources of transistors 706 and 708 are coupled to ground, and the gates of transistors 706 and 708 are coupled to receive a write driver enable signal WDE from row interface 320.

As described above, bit lines $BL_1$ and $BL_1\#$ are pre-charged high prior to a write operation. Thus, the write driver implemented by n-channel transistors 705-708 only needs to discharge the bit line $BL_1$ or the complementary bit line $BL_1\#$ to perform a write operation to a CAM cell within column section 301. To perform a write operation to a CAM cell coupled to bit line pair $BL_1/BL_1\#$, the write driver enable signal WDE is activated high, thereby turning on transistors 706 and 708. The read driver enable signal RDE is de-activated low, thereby turning off transistors 702 and 704. The write data value is driven onto search line pair $SL_1/SL_1\#$. For example, search line $SL_1$ is driven to a logic high state ($V_{DD}$) and search line $SL_1\#$ is driven to a logic low state (ground) in order to write a data value having a logic '1' value. The logic low signal on search line $SL_1\#$ turns off transistor 705, and the logic high signal on search line $SL_1$ turns on transistor 707. As a result, local bit line $BL_1$ remains at the high pre-charge voltage, and local bit line $BL_1\#$ is pulled down to ground (through turned on transistors 707-708). Local sense amplifier SA12 is enabled to amplify this differential signal on bit line pair $BL_1/BL_1\#$, thereby providing a logic '1' write data value on bit line pair $BL_1/BL_1\#$.

To implement a read operation, search lines $SL_1$ and $SL_1\#$ are both pre-charged to a logic high voltage ($V_{DD}$) prior to enabling local sense amplifier SA12. The write driver enable signal WDE and the read driver enable signal RDE are both initially low, such that transistors 702, 704, 706 and 708 are turned off. The word line and local sense amplifier SA12 are enabled in the manner described above, such that a read data value is fully developed on bit lines $BL_1$ and $BL_1\#$. For example, bit line $BL_1$ will be held at a high supply voltage ($V_{DD}$) and bit line $BL_1\#$ will be held at a low supply voltage (ground) if a logic '1' value is read into local sense amplifier SA12. Row interface 320 then activates the read driver enable signal RDE, thereby turning on transistors 702 and 704. Under these conditions, one of the bit lines $BL_1$ or $BL_1\#$ will be at a logic high voltage ($V_{DD}$), thereby turning on the corresponding transistor 701 or 703, respectively, and the other one of the bit lines BL1 or BL1# will be at a logic low voltage (ground), thereby turning off the corresponding transistor 701 or 703. In the described example, the high voltage on bit line BL1 turns on transistor 701 and the low voltage on bit line BL1# turns off transistor 703. Under these conditions, search line $SL_1\#$ is pulled down to ground through turned on transistors 701 and 702. Search line $SL_1$, which is isolated from ground by turned off transistor 703, remains at the high pre-charge voltage. Column interface 310 detects a read data value of '1' in response to the low voltage on search line $SL_1\#$ and the high voltage on $SL_1$.

Although the present invention has been described in connection with various embodiments, it is understood that variations of these embodiments would be obvious to one of ordinary skill in the art. Thus, the present invention is limited only by the following claims.

I claim:

1. A content addressable memory (CAM) array having a column that comprises:
   a first plurality of CAM cells;
   a first local bit line coupled to each of the first plurality of CAM cells, wherein data is read from and written to the first plurality of CAM cells on the first local bit line;
   a first search line coupled to each of the first plurality of CAM cells, wherein search data is applied to the first plurality of CAM cells on the first search line;
   a first sense amplifier coupled to the first local bit line;
   a first tri-state read buffer having an input coupled to the first sense amplifier and an output coupled to the first search line; and
   a column interface coupled to the first search line, wherein the column interface provides the search data on the first search line, and receives read data on the first search line.

2. The CAM array of claim 1, wherein the column further comprises:
   a second plurality of CAM cells, each coupled to the first search line, wherein the search data is applied to the second plurality of CAM cells on the first search line;
   a second local bit line coupled to each of the second plurality of CAM cells, wherein data is read from and written to the second plurality of CAM cells on the second local bit line, and wherein the second local bit line is isolated from the first local bit line;
   a second sense amplifier coupled to the second local bit line; and
   a second tri-state read buffer having an input coupled to the second sense amplifier and an output coupled to the first search line.

3. The CAM array of claim 1, wherein the column further comprises:

a second local bit line coupled to each of the first plurality of CAM cells, wherein data is read from and written to the first plurality of CAM cells on the second local bit line, and wherein the second local bit line is coupled to the first sense amplifier;

a second search line coupled to each of the first plurality of CAM cells, wherein the search data is applied to the first plurality of CAM cells on the second search line;

a first tri-state write buffer having an input coupled to the first search line and output coupled to the first local bit line; and a second tri-state write buffer having an input coupled to the second search line and an output coupled to the second local bit line.

4. The CAM array of claim 1, wherein the column further comprises:

a second local bit line coupled to each of the first plurality of CAM cells, wherein data is read from and written to the first plurality of CAM cells on the second local bit line, and wherein the second local bit line is coupled to the first sense amplifier;

a second search line coupled to each of the first plurality of CAM cells, wherein the search data is applied to the first plurality of CAM cells on the second search line;

a second tri-state read buffer having an input coupled to the first sense amplifier and an output coupled to the second search line.

5. The CAM array of claim 1, wherein the column further comprises:

a first tri-state search buffer coupled to the first search line, wherein the first tri-state search buffer is configured to drive read data from the first tri-state read buffer to the column interface.

6. The CAM array of claim 5, wherein the column further comprises:

a second tri-state search buffer coupled to the first search line, wherein the second tri-state search buffer is configured to drive the search data from the column interface to the first plurality of CAM cells.

7. The CAM array of claim 5, further comprising a row interface coupled to receive a row address for accessing the column, wherein the row interface is coupled to control the first tri-state read buffer.

8. A content addressable memory (CAM) array having a column that comprises:

a column interface;
a first local search line coupled to the column interface;
a first plurality of CAM cell sets each of which includes:
a plurality of CAM cells, each coupled to the first local search line;
a local bit line coupled to each of the plurality of CAM cells in the CAM cell set, wherein local bit lines in different CAM cell sets are isolated from one another;
a local sense amplifier coupled to the local bit line; and
a tri-state read buffer having an input coupled to the local sense amplifier and an output coupled to the first search line.

9. The CAM array of claim 8, wherein the column further comprises:

a second local search line coupling the column interface to the first local search line; and a first tri-state buffer having an input coupled to the first local search line and an output coupled to the second local search line.

10. The CAM array of claim 9, wherein the column further comprises:

a second tri-state buffer having an input coupled to the second local search line and an output coupled to the first local search line.

11. The CAM array of claim 10, wherein each of the first plurality of CAM cell sets further comprises a tri-state write buffer having an input coupled to the first search line and an output coupled to the local sense amplifier.

12. The CAM array of claim 11, further comprising:

a second plurality of CAM cell sets, each of which includes:
a plurality of CAM cells, each coupled to the second local search line;
a local bit line coupled to each of the plurality of CAM cells in the CAM cell set, wherein local bit lines in different CAM cell sets are isolated from one another;
a local sense amplifier coupled to the local bit line; and
a tri-state read buffer having an input coupled to the local sense amplifier and an output coupled to the second search line.

13. A method of operating a column of content addressable memory (CAM) cells comprising:

performing a search operation by routing a search data value from a column interface to a first set of the CAM cells on a first search line; and performing a read operation by routing a read data value from a CAM cell to a local sense amplifier on a first bit line, and routing the read data value from the local sense amplifier to the column interface on the first search line, wherein performing the read operation comprises activating a tri-state read buffer to drive the read data value from the local sense amplifier to the first search line.

14. The method of claim 13, further comprising performing a write operation by routing a write data value from the column interface to the local sense amplifier on the first search line, and routing the write data value from the local sense amplifier to a CAM cell on the first bit line.

15. The method of claim 13, wherein the step of performing the search operation further comprises activating a tri-state buffer to drive the search data value from the first search line to a second search line, wherein the second search line provides the search data value to a second set of the CAM cells in the column.

16. A method of operating a column of content addressable memory (CAM) cells comprising:

performing a search operation by driving a search data value from a column interface to a first search line, and actively driving the search data value from the first search line to a second search line, wherein the first search line is coupled to a first set of CAM cells and the second search line is coupled to a second set of CAM cells; and performing a read operation by routing a read data value from a CAM cell to a local sense amplifier on a first bit line, actively driving the read data value from the sense amplifier to the second search line, and actively driving the read data value from the second search line to the first search line, whereby the read data value is transmitted to the column interface.

17. The method of claim 16, further comprising performing a write operation by driving a write data value from the column interface to the first search line, actively driving the write data value from the first search line to the second search line, and actively driving the write data value from the second search line to the first bit line.

18. The method of claim 16, further comprising performing a write operation by driving a write data value from the column interface to the first search line, actively driving the write data value from the first search line to the second search line, connecting the second search line to the local sense amplifier, whereby the write data value is applied to the local sense amplifier, and then activating the local sense amplifier.

19. The method of claim 16, wherein the step of performing the search operation further comprises driving a complementary search data value from the column interface to a third search line and actively driving the complementary search data value from the third search line to a fourth search line, wherein the third search line is coupled to the first set of CAM cells and the fourth search line is coupled to the second set of CAM cells.

20. The method of claim 19, further comprising performing a write operation by driving a write data value from the column interface to the first search line, driving a complementary write data value from the column interface to the third search line, actively driving the write data value from the first search line to the second search line, actively driving the complementary write data value from the third search line to the fourth search line, actively driving the write data value from the second search line to the first bit line, and actively driving the complementary write data value from the fourth search line to a second bit line.

21. The method of claim 19, further comprising performing a write operation by driving a write data value from the column interface to the first search line, driving a complementary write data value from the column interface to the third search line, actively driving the write data value from the first search line to the second search line, actively driving the complementary write data value from the third search line to the fourth search line, connecting the second search line and the fourth search line to the local sense amplifier, whereby the write data value and complementary write data value are applied to the local sense amplifier, and then activating the local sense amplifier.

* * * * *